(12) United States Patent
Miller et al.

(10) Patent No.: US 6,717,821 B2
(45) Date of Patent: Apr. 6, 2004

(54) INTEGRATED CIRCUIT DEVICE/CIRCUIT BOARD CONNECTION APPARATUS

(75) Inventors: Joseph P. Miller, Cypress, TX (US); Sompong P. Olarig, Cypress, TX (US); Donald J. Stoddard, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/244,876

(22) Filed: Sep. 17, 2002

(65) Prior Publication Data

US 2003/0016490 A1 Jan. 23, 2003

Related U.S. Application Data

(63) Continuation of application No. 09/157,629, filed on Sep. 21, 1998, now Pat. No. 6,456,502.

(51) Int. Cl.[7] .............................. H05K 7/02; H05K 7/06; H05K 7/08; H05K 7/10
(52) U.S. Cl. ........................ 361/760; 361/766; 361/793
(58) Field of Search ................................ 361/760–766, 361/792–795, 784, 785; 257/723–724, 776, 778; 174/255–260

(56) References Cited

U.S. PATENT DOCUMENTS

| | | | |
|---|---|---|---|
| 4,800,459 A | | 1/1989 | Takagi et al. ................. 361/321 |
| 4,803,595 A | * | 2/1989 | Kraus et al. .................. 361/784 |
| 4,870,746 A | * | 10/1989 | Klaser .......................... 29/620 |
| 5,028,986 A | | 7/1991 | Sugano et al. ................. 357/75 |
| 5,036,431 A | | 7/1991 | Adachi et al. ................ 361/412 |
| 5,177,594 A | * | 1/1993 | Chance et al. ............... 257/678 |
| 5,239,448 A | | 8/1993 | Perkins et al. ............... 361/764 |
| 5,243,497 A | | 9/1993 | Chiu ........................... 361/783 |
| 5,281,151 A | * | 1/1994 | Arima et al. .................. 439/68 |
| 5,294,754 A | * | 3/1994 | Wu ............................. 174/255 |
| 5,375,035 A | | 12/1994 | Stoddard .................. 361/306.2 |
| 5,440,699 A | | 8/1995 | Farrand et al. .............. 395/155 |
| 5,459,642 A | | 10/1995 | Stoddard ..................... 361/774 |
| 5,477,933 A | | 12/1995 | Nguyen ........................ 174/262 |
| 5,481,436 A | | 1/1996 | Werther ....................... 361/784 |
| 5,544,017 A | | 8/1996 | Beilin et al. ................. 361/790 |
| 5,574,630 A | * | 11/1996 | Kresge et al. ............... 361/792 |
| 5,610,801 A | * | 3/1997 | Begis .......................... 361/784 |
| 5,635,767 A | * | 6/1997 | Wenzel et al. .............. 257/778 |
| 5,701,233 A | | 12/1997 | Carson et al. ............... 361/735 |
| 5,710,693 A | | 1/1998 | Tsukada et al. ............. 361/686 |
| 5,754,405 A | | 5/1998 | Derouiche ................... 361/744 |
| 5,783,870 A | | 7/1998 | Mostafazadeh et al. ...... 257/791 |
| 5,838,551 A | | 11/1998 | Chan ........................... 361/818 |
| 5,857,086 A | | 1/1999 | Horan et al. ................. 395/309 |
| 5,859,989 A | | 1/1999 | Olarig et al. ................ 395/309 |
| 5,878,237 A | | 3/1999 | Olarig ......................... 395/308 |
| 5,889,970 A | | 3/1999 | Horan et al. ................. 395/306 |

(List continued on next page.)

FOREIGN PATENT DOCUMENTS

JP         3-280487 A       12/1991  ................... 439/83

*Primary Examiner*—Kamand Cuneo
*Assistant Examiner*—Tuan Dinh

(57) ABSTRACT

In a computer system two integrated circuit devices are operatively mounted on the main system board using a pair of interstitial circuit boards sandwiched between the integrated circuit devices and the system board and having substantially smaller footprints than the system board. Each interstitial board has a series of terminating components, representatively resistors, interposed in its circuitry which interconnects the associated integrated circuit board with system board circuitry that, in turn, operatively couples the two integrated circuit boards. The incorporation of the terminating components in the interstitial boards instead of in the system board reduces the circuit complexity of the system board and the required number of layers therein, thereby reducing the cost of the system board and substantially simplifying its signal trace routing design.

11 Claims, 2 Drawing Sheets

U.S. PATENT DOCUMENTS

| | | | | |
|---|---|---|---|---|
| 5,892,964 A | | 4/1999 | Horan et al. | 395/800.23 |
| 5,907,903 A | | 6/1999 | Ameen et al. | 29/830 |
| 5,923,860 A | | 7/1999 | Olarig | 395/309 |
| 5,937,173 A | | 8/1999 | Olarig et al. | 395/306 |
| 5,944,809 A | | 8/1999 | Olarig et al. | 710/260 |
| 5,974,250 A | | 10/1999 | Angelo et al. | 395/653 |
| 6,018,810 A | | 1/2000 | Olarig | 714/43 |
| 6,021,466 A | | 2/2000 | Olarig | 711/122 |
| 6,026,221 A | * | 2/2000 | Ellison et al. | 700/121 |
| 6,061,794 A | | 5/2000 | Angelo et al. | 713/200 |
| 6,070,253 A | | 5/2000 | Tavallaei et al. | 714/31 |
| 6,094,056 A | * | 7/2000 | Bardsley et al. | 324/754 |
| 6,098,132 A | | 8/2000 | Olarig et al. | 710/103 |
| 6,134,638 A | | 10/2000 | Olarig et al. | 711/167 |
| 6,167,476 A | | 12/2000 | Olarig et al. | 710/128 |
| 6,175,889 B1 | | 1/2001 | Olarig | 710/129 |
| 6,201,701 B1 | * | 3/2001 | Linden et al. | 361/720 |
| 6,223,239 B1 | | 4/2001 | Olarig | 710/129 |
| 6,230,223 B1 | | 5/2001 | Olarig | 710/126 |
| 6,230,225 B1 | | 5/2001 | Olarig et al. | 710/128 |
| 6,246,666 B1 | | 6/2001 | Purcell et al. | 370/221 |
| 6,252,177 B1 | | 6/2001 | Stoddard | 174/260 |
| 6,260,127 B1 | | 7/2001 | Olarig et al. | 711/167 |
| 6,360,333 B1 | | 3/2002 | Jansen et al. | 714/25 |
| 6,363,449 B1 | | 3/2002 | Sides et al. | 710/129 |
| 6,370,657 B1 | | 4/2002 | Jansen et al. | 714/23 |
| 6,449,677 B1 | | 9/2002 | Olarig et al. | 710/305 |

* cited by examiner

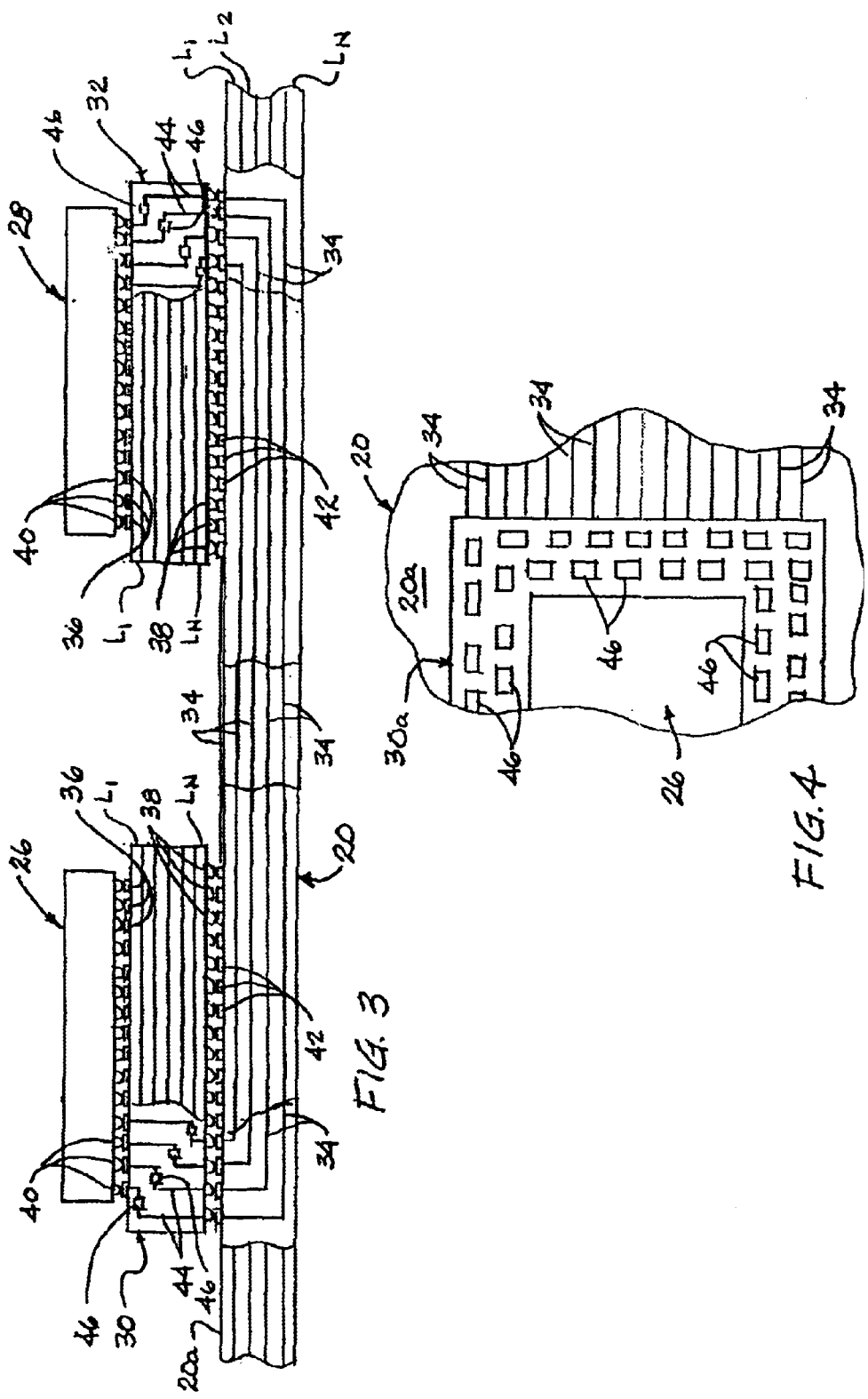

INTEGRATED CIRCUIT DEVICE/CIRCUIT BOARD CONNECTION APPARATUS

This application is a continuation of Ser. No. 09/157,629 filed Sep. 21, 1998, now U.S. Pat. No. 6,456,502.

BACKGROUND OF THE INVENTION

1. Field of the Invention

The present invention generally relates to electronic apparatus and, in a preferred embodiment thereof, more particularly relates to the mounting of integrated circuit devices on a circuit board such as the main system board of a computer.

2. Description of Related Art in a computer system a variety of integrated circuit devices are typically mounted on the main system circuit board or "motherboard" of the computer. Integrated circuit devices include, among other types, ASIC's (application specific integrated circuits), processors, memory controllers, and I/O controllers. Using conventional design and assembly techniques, an integrated circuit device is typically mounted directly to a side of the system board using, for example, pins on the integrated circuit device that are received in conductively lined vias disposed in the system board and connected to electrically conductive signal traces branching out from the vias. The pins thus electrically couple the circuitry within the mounted integrated circuit device to these signal traces which, in turn, are extended to other system board components such as other integrated circuit devices. Various alternate connection structures, such as ball grid array and pad systems and separate pin-and-socket connector structures have been alternatively utilized to mount integrated circuit devices on computer system boards or other types of circuit boards in other types of electronic apparatus.

In order to reduce undesirable degradation in the integrated circuit device signals being routed through the system board traces coupled to the integrated circuit device, termination components are interposed within the system board signal traces. Such termination components are commonly resistors, but may include other components such as, for example, capacitors, inductors, diodes, or various combinations of these types of termination components.

Modern high signal speed integrated circuit devices are being fabricated in increasingly smaller sizes, while at the same time being provided with increasing numbers of connector pins or other connection interface structures. For example, many modern high speed integrated circuit devices have 1000 or more connector pins or pads, thus requiring a corresponding number of system board signal traces. Because of this increased pin density within a reduced spatial footprint, coupled with the increased signal speed of the integrated circuit device, the system board signal traces must often be quite close together, with each trace requiring a termination component therein, the traces must often have equal lengths, and the trace lengths between the terminating components and their associated integrated circuit device connector pins must often be equal.

Taken together, these requirements for modern high speed/high pin count integrated circuit devices make the design of the system board quite difficult from a signal trace positioning and routing standpoint. As a practical matter, when these high speed/high pin count integrated circuit devices are to be mounted on a system board it is necessary to route a considerable number of the integrated circuit device signal traces through the interior of the system board to solve the unavoidable trace congestion problem adjacent the mounted integrated circuit device.

This necessitates a considerable thickening of the entire system board to solve a trace congestion problem which is localized at the integrated circuit board area of the system board—the thickening of the rest of the system board typically creating a substantial additional system board cost with no appreciable operational benefit.

It can thus be seen that there is a need for improved apparatus for mounting an integrated circuit board device to a computer main system board, or other type of circuit board, which addresses the above-mentioned circuit board signal trace routing problems. It is to this need that the present invention is directed.

SUMMARY OF THE INVENTION

In carrying out principles of the present invention, in accordance with a preferred embodiment thereof, electronic apparatus is provided that comprises a first circuit board, representatively a computer motherboard, having first electrical circuitry; an integrated circuit device having second electrical circuitry; and a second circuit board representatively sandwiched between the first circuit board and the integrated circuit device and having third electrical circuitry.

According to a key aspect of the invention, the third electrical circuitry has a series of termination components interposed therein and operatively couples the first and second electrical circuitry. The termination components function to reduce degradation in integrated circuit device signals and representatively include resistors, but could include other types of components such as, for example, capacitors, inductors or diodes.

Because the termination components are carried by the second circuit board instead of being interposed in the electrical circuitry of the first circuit board, the first circuit board does not have to be thickened over its entire area merely to accommodate termination devices in the vicinity of the integrated circuit device thereon, and the integrated circuit device circuit routing on the first circuit board is substantially simplified. Representatively, the second circuit board has a footprint area substantially smaller than that of the first circuit board, and the terminating components are embedded within the second circuit board. Alternatively, at least some of the termination components may be surface-mounted on the second circuit board.

Illustratively, the integrated circuit device and the interstitial second circuit board are coupled by interconnected first conductive ball and pad arrays on facing side surfaces thereof, and the first and second circuit boards are coupled by interconnected second conductive ball and pad arrays on facing side surfaces thereof. Alternatively, however, the operative coupling of these three components could be effected using other types of cooperating connection structures such as, for example, connector pins and associated conductively lined through-holes. The interstitial second circuit board illustratively has a plurality of body layers which may include power and ground planes.

This unique integrated circuit device-to-circuit board connection technique illustratively utilizing an interstitial circuit board is representatively incorporated in a CPU unit portion of computer system, with the first circuit board being the CPU unit motherboard and the CPU unit further including a microprocessor and a data storage device operative to store data retrievable by the microprocessor. However, principles of the present invention may also be used to advantage in conjunction with a wide variety of other types of circuit boards in other types of electronic apparatus.

Instead of being sandwiched between the first circuit board and the integrated circuit device, the second circuit board could be mounted on the same side of the first circuit board as the integrated circuit board but spaced apart therefrom, or mounted on the opposite side of the first circuit board.

BRIEF DESCRIPTION OF THE DRAWINGS

FIG. 3 is a schematic, partially elevational cross-sectional view through the main system board portion taken along line 3—3 of FIG. 2 and illustrating the interstitial board connection of the integrated circuit devices to the main system board; and FIG. 4 is a top plan view of a portion of one of the FIG. 2 integrated circuit devices connected to the underlying main system board with an alternate embodiment of one of the interstitial boards.

DETAILED DESCRIPTION

Figure 1:
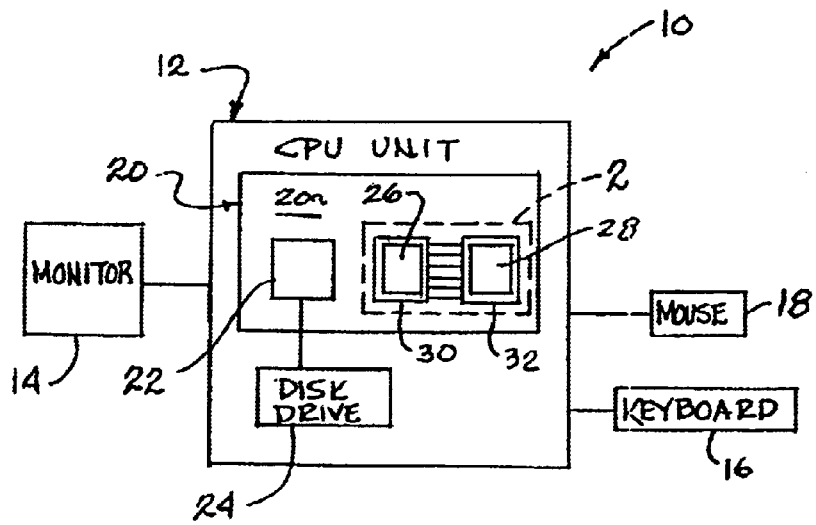
FIG. 1 is a schematic diagram of a representative computer system incorporating therein integrated circuit devices operatively mounted on a main system board using interstitial terminating component boards embodying principles of the present invention.

Schematically depicted in FIG. 1 is a representative computer system 10 embodying principles of the present invention and including a CPU unit 12 operatively connected as shown to a monitor 14, a keyboard 16 and a pointing device, representatively a mouse 18. Disposed within the CPU unit 12 is a multi-layered main system circuit board or motherboard 20, a microprocessor 22 mounted on the top side 20a of the system board 20, and a data storage device, representatively a hard disk drive 24, operative to store data retrievable by the microprocessor 22.

Figure 2:
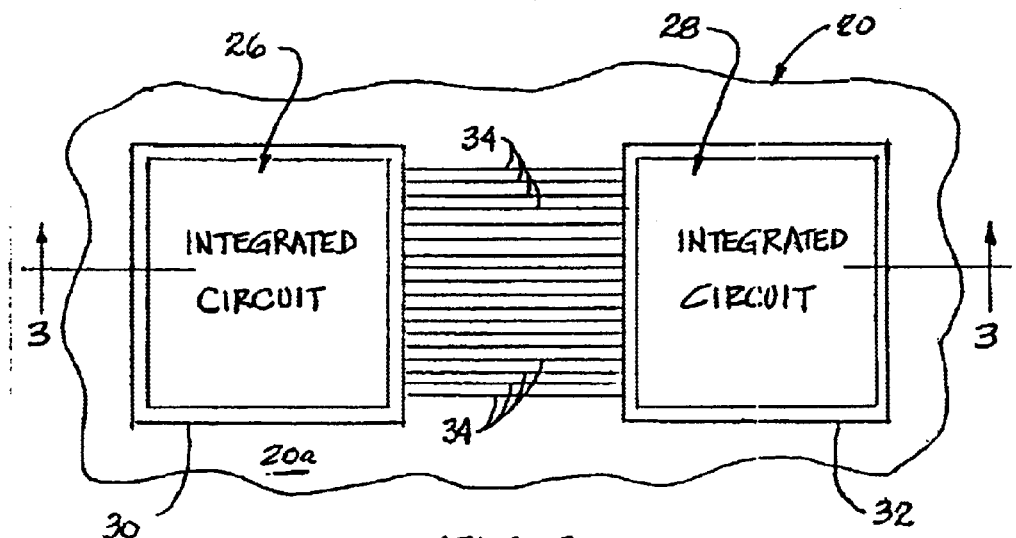
FIG. 2 is an enlarged scale top plan detail view of the main system board portion within the dashed line area "2" in FIG. 1.

First and second integrated circuit devices 26 and 28 (see FIGS. 1 and 2) are also illustratively mounted on the top side 20a of the system board 20, in a unique manner embodying principles of the present invention, using specially designed interstitial circuit boards 30 and 32 respectively sandwiched between the integrated circuit devices 26,28 and the top side 20a of the system board 20. The interstitial circuit boards 30 and 32, and thus the integrated circuit devices 26 and 28, are operatively coupled by a series of electrical conductive signal traces 34 carried by the system board 20. For purposes of discussion, it will be assumed that some of the traces 34 are run along the top side 20a of the system board 20, with the balance of the traces 34 being internally embedded in the system board between its various layers $L_1$–$L_N$ (see FIG. 3). Each of the integrated circuit devices 26 and 28 could be a variety of types of electronic components including, but not limited to, a processor, an ASIC (application specific integrated circuit), a memory controller or an I/O controller.

Turning now to FIG. 3, it can be seen that each of the interstitial circuit boards 30 and 32 has a plurality of layers $L_1$–$L_N$. On the top side of each interstitial circuit board 30,32 is a spaced array of metal connection pads 36, and on the bottom side of each interstitial circuit board 30,32 is a spaced ball grid array (BGA) of solder balls 38. The bottom sides of the integrated circuit devices 26 and 28 have ball grid arrays of solder balls 40 which are fused to the underlying metal connection pads 36, and the solder balls 38 on the bottom sides of the interstitial circuit boards 30 and 32 are fused to underlying series of metal connection pads 42 disposed on the top side 20a of the system board 20. As schematically illustrated in FIG. 3, the opposite ends of each of the system board signal traces 34 are coupled to connection pads 42 underlying the spaced apart interstitial boards 30,32.

The circuitry within each of the interstitial boards 30,32 includes a series of electrically conductive traces 44 each interconnecting one of the interstitial board's top side pads 36 with one of its bottom side solder balls 38. Thus, electrical signals sent, for example, from the circuitry in the integrated circuit device 26 to the circuitry in the integrated circuit device 28 are sequentially transmitted through (1) the internal traces 44 in the interstitial board 30, (2) the system board traces 34, and (3) internal traces 44 in the interstitial board 32. Signals sent from the integrated circuit device 28 to the integrated circuit device 26, of course, follow a reversed path through the traces 44 and 34.

According to a key aspect of the present invention, terminating components 46, which function to reduce degradation of the integrated circuit device signals, are embedded within the interstitial circuit boards 30,32 and interposed in their internal traces 44 as schematically indicated in FIG. 3. These embedded terminating components 46 are representatively resistors, but could also include other types or combinations of components such as, for example, capacitors, inductors or diodes. As previously mentioned, each of the interstitial circuit boards 30 and 32 has a plurality of layers $L_1$–$L_N$. Some of these layers may be power and ground planes to provide low dynamic impedance return paths for termination circuits.

Because the terminating components 46 are disposed within the interstitial boards 30 and 32, instead of being placed on or in the main system board 20 as is conventionally done, the integrated circuit device signal trace routing on the system board is greatly simplified, and the system board 20 does not have to be substantially thickened over its entire area merely to accommodate the terminating components 46 in the region of the integrated circuit devices 26 and 28. By placing the terminating components 46 in the interstitial boards 30 and 32, the combined horizontal footprints of which are substantially smaller than that of the main system board 20, the overall cost of the system board 20 is materially reduced.

FIG. 4 illustrates, in top plan view, the use of an alternately configured interstitial circuit board 30a in which the length and width of the board 30a are substantially increased to permit some or all of its associated termination components 46 to be mounted on a top side surface area thereof that horizontally extends outwardly around the periphery of the overlying integrated circuit device 26. These surface-mounted terminating devices 46, like their embedded counterparts (if any) are operatively interposed within the device's circuitry traces 44 as schematically depicted in FIG. 3.

In assembling the various components on the system board 20, the integrated circuit devices 26 and 28 and their associated interstitial boards 30 and 32 may first be conveniently formed as modules or subassemblies 26,30 and 28,32 which are subsequently attached to the system board 20 as schematically illustrated in FIG. 3.

While the interstitial circuit boards 30 and 32 have been representatively illustrated and described herein as being used to mount the integrated circuit devices 26 and 28 on the main system board 20 of a computer system 10, it will be readily appreciated by those of ordinary skill in this particular art that principles of the present invention may also be utilized to advantage to operatively mount one or more integrated circuit devices on other types of circuit boards in other types of electronic apparatus, and is not limited to computer system motherboard applications.

As schematically depicted in FIG. 3, the connection structures used to interconnect the integrated circuit devices 26,28 to their associated interstitial boards 30 and 32, and to interconnect the interstitial boards 30 and 32 to the underlying system board 20 are representatively cooperating ball grid/conductive pad arrays. However, if desired, a variety of other types of interconnection structures, such as conductive pins and associated conductively lined sockets, could be alternatively utilized if desired.

While the terminating component-carrying circuit boards 30 and 32 have been representatively illustrated and described herein as being respectively sandwiched between the integrated circuit devices 26,28 and the top side 20a of the system board 20, it will be appreciated by those of skill in this particular art that the circuit boards 30 and 32 could, for example, be alternatively placed on the top side of the system board 20 in horizontally offset relationships with the integrated circuit devices 26 and 28, or positioned on the bottom side of the system board, if desired.

The foregoing detailed description is to be clearly understood as being given by way of illustration and example only, the spirit and scope of the present invention being limited solely by the appended claims.

What is claimed is:

1. An electronic apparatus, comprising:
    a motherboard having first electrical circuitry;
    a processor disposed on the motherboard and having second electrical circuitry; and
    a first member disposed on the motherboard and adapted to receive the processor, the first member comprising:
        a plurality of body layer, wherein the plurality of body layers include power and ground planes; and
        third electrical circuitry comprising a series of termination components adapted to electrical couple data between the first and second electrical circuity, wherein the series of termination components comprises a resistor and at least some of the termination components are embedded within the interior of the first member.

2. The electronic apparatus of claim 1 wherein the motherboard is a motherboard for computer.

3. The electronic apparatus of claim 1 wherein at least some of the termination components are surface mounted on the first member.

4. The electronic apparatus of claim 1 wherein the first member has a substantially smaller footprint area than the motherboard.

5. An electronic apparatus, comprising:
    a first circuit board having a first series of electrically conductive traces;
    a processor having processor electrical circuitry;
    a second circuit board disposed between the first circuit board and the processor, said second circuit board comprising:
        a second series of electrically conductive traces in which termination components are operatively disposed, wherein at least some of the termination components are embedded within the interior of the second circuit board and include resistors; and
        a plurality of body layers, wherein the plurality of body layers include power and ground planes;
    first cooperating structures disposed on the processor and the second circuit board and operatively interconnecting them in a manner coupling the processor electrical circuitry to the second series of electrically conductive traces; and
    second cooperating structured disposed on the second circuit board and the first circuit board and operatively interconnecting them in a manner coupling said first and second series of electrically conductive traces.

6. The electronic apparatus of claim 5 wherein the first cooperating structures are interconnected conductive ball and pad arrays.

7. The electronic apparatus of claim 5 wherein the second cooperating structures are interconnected conductive ball and pad arrays.

8. The electronic apparatus of claim 5 wherein each of the first and second cooperating structures include interconnected conductive ball and pad arrays.

9. The electronic apparatus of claim 5 wherein the first circuit board is a motherboard.

10. The electronic apparatus of claim 5 wherein at least some of the termination components are surface mounted on the second circuit board.

11. The electronic apparatus of claim 5 wherein the second circuit board has a substantially smaller footprint area than the first circuit board.

* * * * *